United States Patent
You et al.

(10) Patent No.: US 7,041,558 B2
(45) Date of Patent: May 9, 2006

(54) FLOATING GATE MEMORY DEVICE AND METHOD OF MANUFACTURING THE SAME

(75) Inventors: Young-Sub You, Gyeonggi-do (KR); Hun-Hyeoung Leam, Gyeonggi-do (KR); Sang-Hoon Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 75 days.

(21) Appl. No.: 10/698,825

(22) Filed: Oct. 31, 2003

(65) Prior Publication Data

US 2004/0229432 A1 Nov. 18, 2004

(30) Foreign Application Priority Data

Nov. 7, 2002 (KR) .................. 10-2002-0068939

(51) Int. Cl.
*H01L 21/8247* (2006.01)
(52) U.S. Cl. ...................... 438/264; 438/657
(58) Field of Classification Search ............... 438/257, 438/259, 264, 296, 594, 657
See application file for complete search history.

(56) References Cited

U.S. PATENT DOCUMENTS 5,767,004 A * 6/1998 Balasubramanian et al. ................. 438/592
6,221,744 B1 * 4/2001 Shih et al. .................. 438/585
6,222,225 B1 * 4/2001 Nakamura et al. .......... 257/315
6,391,722 B1 * 5/2002 Koh ........................... 438/264

FOREIGN PATENT DOCUMENTS

KR 1020040003895 1/2004

OTHER PUBLICATIONS

English language abstract of Korean Publication No. 1020040003895.

* cited by examiner

*Primary Examiner*—Chandra Chaudhari
(74) *Attorney, Agent, or Firm*—Marger Johnson & McCollom, P.C.

(57) ABSTRACT

Disclosed herein is a method of forming a floating gate in a non-volatile memory device having a self-aligned shallow trench isolation (SA-STI) structure. First, a tunnel oxide layer is formed on a semiconductor substrate having a SA-STI structure. Next, a first floating gate layer is formed on the tunnel oxide layer at a first temperature of no less than about 530° C. A second floating gate layer is then formed on the first floating gate layer at a second temperature of no more than 580° C. After depositing the first floating gate layer, the second floating gate layer is in-situ deposited to prevent the growth of a native oxide layer on the surface of the first floating gate layer. Thus, gate resistance can be reduced and process time can be shortened.

19 Claims, 4 Drawing Sheets

FLOATING GATE MEMORY DEVICE AND METHOD OF MANUFACTURING THE SAME

CROSS REFERENCE TO RELATED APPLICATIONS

This application claims priority under 35 USC § 119 to Korean Patent Application 2002-68939, filed on Nov. 7, 2002, the contents of which are herein incorporated by reference in their entirety.

BACKGROUND OF THE INVENTION

1. Field of the Invention

The present invention relates to a semiconductor device and method for manufacturing the device. More particularly, the present invention relates to a floating gate in a non-volatile memory device having a self-aligned shallow trench isolation structure and the method of making the device.

2. Description of the Related Art

Semiconductor memory devices can in general be divided into volatile memory devices and non-volatile memory devices. Random access memory (RAM) devices and dynamic random access memory (DRAM) device are examples of volatile memory devices. Static random access memory (SRAM) device and read only memory (ROM) devices are examples of non-volatile memory devices. In volatile memory, the stored data on the cell is destroyed if the power is interrupted while in non-volatile memory the stored data on the cell is retained even when the power is temporarily interrupted.

Among those ROM devices, there is an increased demand for flash memory devices or electrically erasable and programmable ROM (EEPROM) devices capable of inputting and outputting data electrically. A flash memory device is a kind of advanced EEPROM, in which the input and output of data are electrically controlled by F-N (Fowler-Nordheim) tunneling or a channel hot electron injection.

Highly integrated flash memory can be used as a storage media similar to a magnetic disk because it has advantages over traditional ROM devices such as a small cell area, a fast access time, a low power dissipation, etc. However, for flash memory devices to replace magnetic disk memory, the cost per bit must be reduced. Decrease in the cost per bit many in general may be accomplished by decreasing the number of processes and the cell size.

FIG. 1 is a cross-sectional view illustrating a conventional method of manufacturing a flash memory device having a self-aligned shallow trench isolation structure.

Referring to FIG. 1, an oxide layer, a first polycrystalline silicon layer, and a nitride layer are successively formed on a silicon substrate 10 and then, these layers are patterned by a photolithography process to form a tunnel oxide layer 12, a first floating gate 14, and a nitride layer pattern 16. Next, an exposed portion of the substrate 10 is etched to a predetermined depth, thereby forming a trench 18. That is, active regions and floating gates are simultaneously defined during the trench formation process using the single mask.

Thereafter, exposed portions of the trench 18 are subjected to thermal treatment in an oxygen atmosphere for curing silicon damages caused by high-energy ion bombardment during the trench etching process. By doing so, a trench inner-wall oxide layer 20 is formed along the inner surface including the bottom surface and sidewall of the trench 18 by an oxidation reaction between the exposed silicon and the oxidant.

FIG. 2 is an enlarged view showing portion "A" in FIG. 1.

During the above oxidizing process, the oxidant encroaches upon the side of the tunnel oxide layer 12 at the lower portion of the first floating gate 14 to form "bird's beaks" at both ends of the tunnel oxide layer 12 (refer to as "a" in FIG. 2). Because the bottom edge portions of the first floating gate 14 are bent outward while both end portions of the tunnel oxide layer 12 expand due to the "bird's beaks", the lower portions of the sidewalls of the first floating gate 14 have a positive slope (refer to as "b" in FIG. 2) and channel width (W) decreases. Here, positive slope denotes that the sidewall slope allows the sidewall to erode from the etchant. In other words, as shown in FIG. 2, the intrusion of the oxidant into the portion underlying the nitride layer pattern 16 is blocked by the existence of the nitride layer pattern 16 to provide the negative slope at the upper portion of the sidewall of the first floating gate 14. Meanwhile, the bottom edge portion of the lower portion of the first floating gate 14 is bent outward and has a positive slope, which is eroded by the etchant introduced from the upper portion of the substrate. It is applied in the same manner as in the sidewall of a mesa structure and acts as a stopping layer for the underlying layer when the etchant is applied.

Next, a CVD-oxide layer is deposited to fill up the trench 18 and then, removed by a chemical mechanical polishing (CMP) process until the upper surface of the nitride layer pattern 16 is exposed, thereby forming a field oxide layer (not shown) in the trench 18.

After removing the nitride layer pattern 16 by a phosphoric acid stripping process, a material identical to that of the first floating gate 14 is deposited to form a second polycrystalline layer for the purpose of forming a second floating gate on the upper portion of the first floating gate 14 and the field oxide layer 22. The second polycrystalline layer is partially removed via a photolithography process to form the second floating gate (not shown) in a cell that is separated from those of neighboring cells. The second floating gate makes electrical contact with the first floating gate 14 and functions to increase the area of a dielectric layer which is formed in a subsequent process.

In the conventional method, the channel width decreases and a void can occur in the field oxide layer because the lower portions of the sidewalls of the first floating gate 14 have the positive slope.

SUMMARY OF THE INVENTION

The present invention is directed to solving the aforementioned problems. Accordingly, the present invention provides an improved floating gate non-volatile memory device having a self-aligned shallow trench isolation (hereinafter, referred to as "SA-STI") structure and a method of making such a device.

The present invention provides an improved flash memory cell having a SA-STI structure. An active pattern for defining an active region and a floating gate pattern are simultaneously formed on a semiconductor substrate and, the space between a bit line and an adjacent bit line is decreased to reduce a memory cell size.

The present invention also provides a modified SA-STI process capable of preventing the sidewalls of the first floating gate from having the positive slope. Specifically, a field oxide layer of SA-STI structure is formed using the first floating gate and then, the first floating gate having the positive slope is removed. A first floating gate layer made of a doped polycrystalline silicon is re-deposited at a high temperature of more than 580° C. and then, a cleaning process is carried out. Next, a second floating gate layer made of a doped polycrystalline silicon is deposited at a lower temperature of about 530° C.

According to the above method, after depositing the first floating gate layer, the wafer (i.e., substrate) is cleaned by a cleaning equipment and the second floating gate layer is then deposited by deposition equipment. Since the substrate is exposed to the atmosphere during the transferring of the substrate from the cleaning equipment to the deposition equipment, a native oxide layer is grown to a thickness of about 15 Å on the upper surface of the first floating gate layer. The native oxide layer formed between the first floating gate layer and the second floating gate layer increases the gate resistance, resulting in the deterioration of the electrical characteristics of the device. Further, the process time increases because the first floating gate layer and the second floating gate layer are deposited in separate steps.

According to one aspect of the present invention, a tunnel oxide layer is formed on a semiconductor substrate having a SA-STI structure. A first floating gate layer is formed on the tunnel oxide layer at a first temperature of no less than about 530° C. A second floating gate layer is formed on the first floating gate layer at a second temperature of no more than about 580° C.

Preferably, the first floating gate layer comprises either doped polycrystalline silicon or undoped polycrystalline silicon, while the second floating gate layer comprises either doped amorphous silicon or undoped amorphous silicon.

In a method of manufacturing a non-volatile memory device according to another aspect of the present invention, a tunnel oxide layer is formed on a semiconductor substrate having a self-aligned shallow trench isolation structure. Then, the substrate is loaded in deposition equipment. Here, doped polycrystalline silicon is deposited on the tunnel oxide layer by introducing a first doping gas in the deposition equipment at a first temperature of no less than about 530° C., thereby forming a first floating gate layer. A doped amorphous silicon is in-situ deposited on the first floating gate layer by introducing a second doping gas in the deposition equipment at a second temperature of no more than about 580° C. Finally, the substrate is unloaded from the deposition equipment.

In a method of manufacturing a non-volatile memory device according to still another aspect of the present invention, a tunnel oxide layer is formed on a semiconductor substrate having a self-aligned shallow trench isolation structure. Again, the substrate is loaded in deposition equipment. This time however, undoped polycrystalline silicon is deposited on the tunnel oxide layer at a first temperature of no less than about 530° C. to thereby form a first floating gate layer. Then, a doped amorphous silicon is in-situ deposited on the first floating gate layer while introducing a doping gas in the deposition equipment at a second temperature of no more than about 580° C. to thereby form a second floating gate layer. Finally, the substrate is unloaded from the deposition equipment.

In a method of manufacturing a non-volatile memory device according to still another aspect of the present invention, a tunnel oxide layer is formed on a semiconductor substrate having a self-aligned shallow trench isolation structure. Then, the substrate is loaded in deposition equipment. In this aspect of the present invention, undoped polycrystalline silicon is deposited on the tunnel oxide layer at a first temperature of no less than about 530° C. to thereby form a first floating gate layer. Then, undoped amorphous silicon is in-situ deposited on the first floating gate layer at a second temperature of no more than about 580° C. to thereby form a second floating gate layer. After unloading the substrate from the deposition equipment, a dopant is ion-implanted against the substrate on which the second floating gate layer is formed, to thereby dope the first and second floating gate layers with the dopant.

In a non-volatile memory device having a SA-STI structure according to the present invention, the first floating gate layer and the second floating gate layers are in-situ deposited to prevent the growth of a native oxide layer on the surface of the first floating gate layer. Thus, gate resistance can be improved and process time can be reduced.

BRIEF DESCRIPTION OF THE DRAWINGS

The above and other objects and advantages of the present invention will become readily apparent by reference to the following detailed description when considered in conjunction with the accompanying drawings wherein.

DESCRIPTION OF THE PREFERRED EMBODIMENTS

Figure 1:
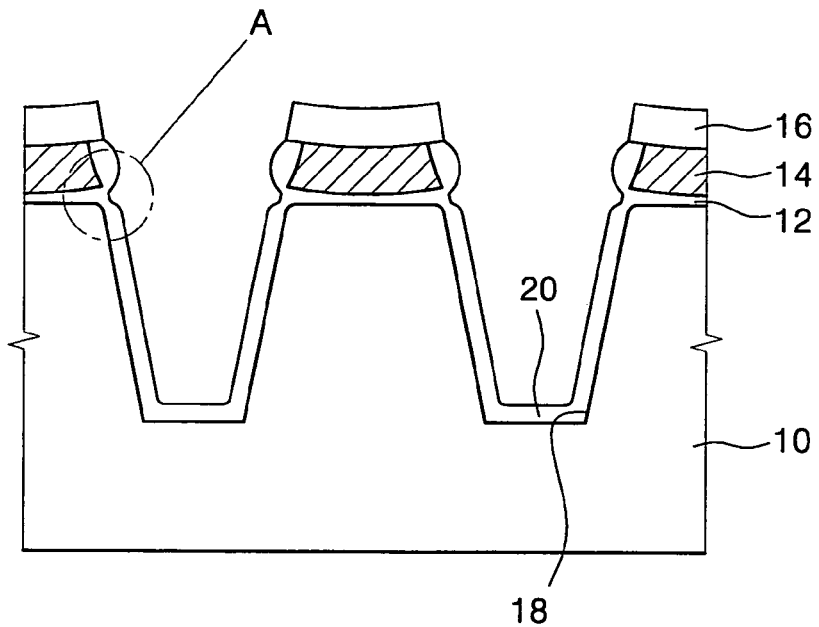
FIG. 1 is a cross-sectional view illustrating a conventional method of manufacturing a flash memory device having a SA-STI structure.
Figure 2:
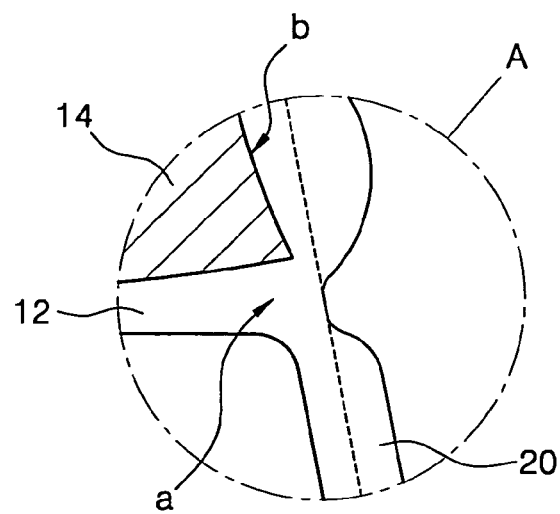
FIG. 2 is an enlarged view showing portion "A" in FIG. 1.

Hereinafter, embodiments of the present invention will be described in detail with reference to the accompanying drawings. In the drawings, the thickness of layers and regions are exaggerated for clarity. It will be understood that when an element such as a layer, region, or substrate is referred to as being "on" another element, it can be directly on the other element or intervening elements may also be present.

Furthermore, relative terms, such as "beneath", may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as "below" other elements would then be oriented "above" the other elements. Therefore, the term "below" can encompass both an orientation above and below a designated component.

Figure 3A:
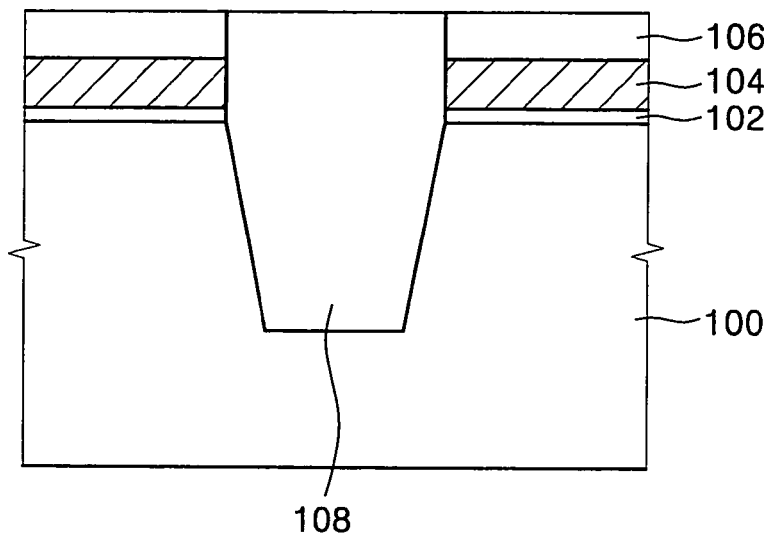
FIGS. 3A to 3C are cross-sectional views illustrating a method of manufacturing a flash memory device having a SA-STI structure in accordance with the present invention.
Figure 3B:
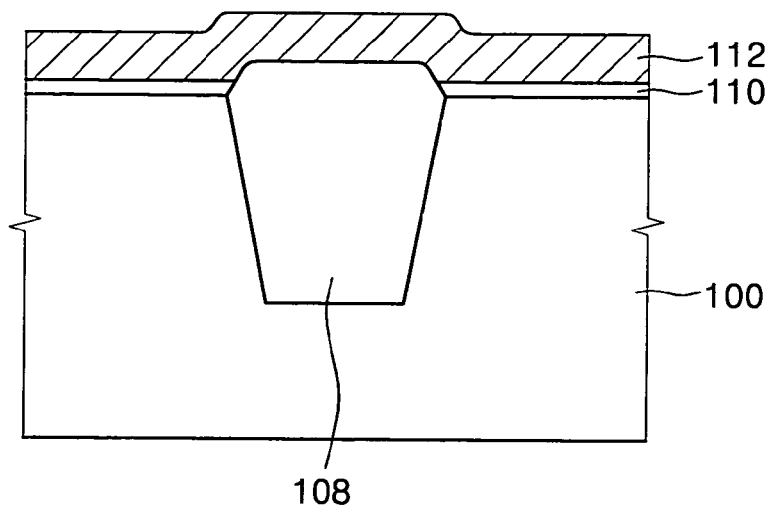
Figure 3C:
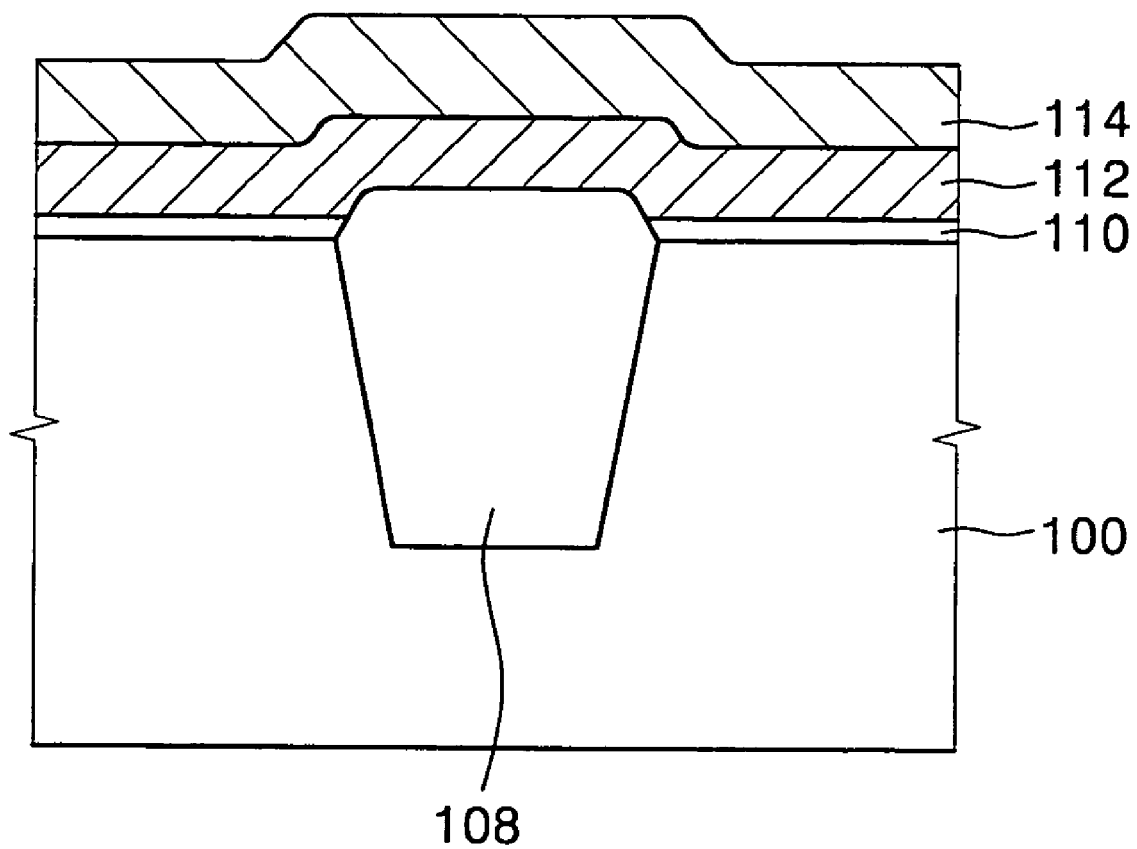

FIGS. 3A to 3C are cross-sectional views illustrating a method of manufacturing a non-volatile memory device having a SA-STI structure in accordance with the present invention.

Referring to FIG. 3A, a field oxide layer 108 is formed on a semiconductor substrate 100 by a SA-STI method where an active pattern for defining an active region and a floating gate pattern are simultaneously formed. Here, reference numeral 102 indicates a pad oxide layer pattern, reference numeral 104 indicates a floating gate pattern, and reference numeral 106 indicates a nitride layer pattern.

Referring to FIG. 3B, the floating gate pattern 104 is removed by a dry etching process and the underlying pad oxide layer pattern 102 is then removed by a wet etching process. By doing so, the floating gate pattern 104 whose sidewalls have the positive slope through the process of forming the SA-STI, is removed to prevent the reduction of a channel width and the generation of voids in the field oxide layer 108.

Next, after forming a gate oxide layer of a cell transistor, i.e., a tunnel oxide layer 110 on the field oxide layer 108 and the substrate 100, a first floating gate layer 112 is formed on the tunnel oxide layer 110 of the gate oxide layer. The first floating gate layer 112 comprises either doped polycrystalline silicon or undoped polycrystalline silicon and is deposited at a first temperature of no less than about 530° C., preferably between 530° C.~650° C.

If the first floating gate layer 112 comprises amorphous silicon, the first floating gate layer 112 is phase-transformed from an amorphous phase into a crystalline phase by a subsequent heat treatment so that the volume of the layer is reduced. This generates a very large stress on the interface between the first floating gate layer 112 and the underlying tunnel oxide layer 110, and often results in deterioration of the reliability of the tunnel oxide layer 110.

Further, when the first floating gate layer 112, comprising polycrystalline silicon, is doped with an N-type impurity by POC13 diffusion or ion implantation, the dopant migrates along the grain boundary of the polycrystalline layer and penetrates into the tunnel oxide layer 110, thereby deteriorating it. Accordingly, the first floating gate layer 112 in the present invention is formed by depositing a polycrystalline silicon layer while being in-situ doped, or depositing an undoped polycrystalline silicon layer at a first temperature of no less than 530° C. so as to prevent the deterioration of the tunnel oxide layer 110.

Referring to FIG. 3C, a second floating gate layer 114 is in-situ deposited on the first floating gate layer 112. The second floating gate layer 114 comprises either doped amorphous silicon or undoped amorphous silicon and is deposited at a second temperature of no more than about 580° C., preferably less than about 550° C. The second floating gate layer 114 increases the area of a dielectric layer that is to be formed in a subsequent process, which is preferably formed as thick as possible. The second floating gate layer 114 comprising amorphous silicon is phase-transformed into the crystalline phase by a heat budget provided in subsequent processes.

Then, though not shown in the figure, the first and second floating gate layers 112 and 114 are etched away over the field oxide layer 108 through a photolithography process. Thus, the previously formed first and second floating gate layers 112 and 114 are separated from those of the neighboring cells.

Then, a dielectric layer (not shown), such as ONO, and a control gate (not shown) are successively deposited on the resultant structure. The control gate, the dielectric layer, the second floating gate layer 114, and the first floating gate layer 112 are dry etched via a photolithography process to thereby complete a stacked gate of a memory cell transistor.

Figure 4:
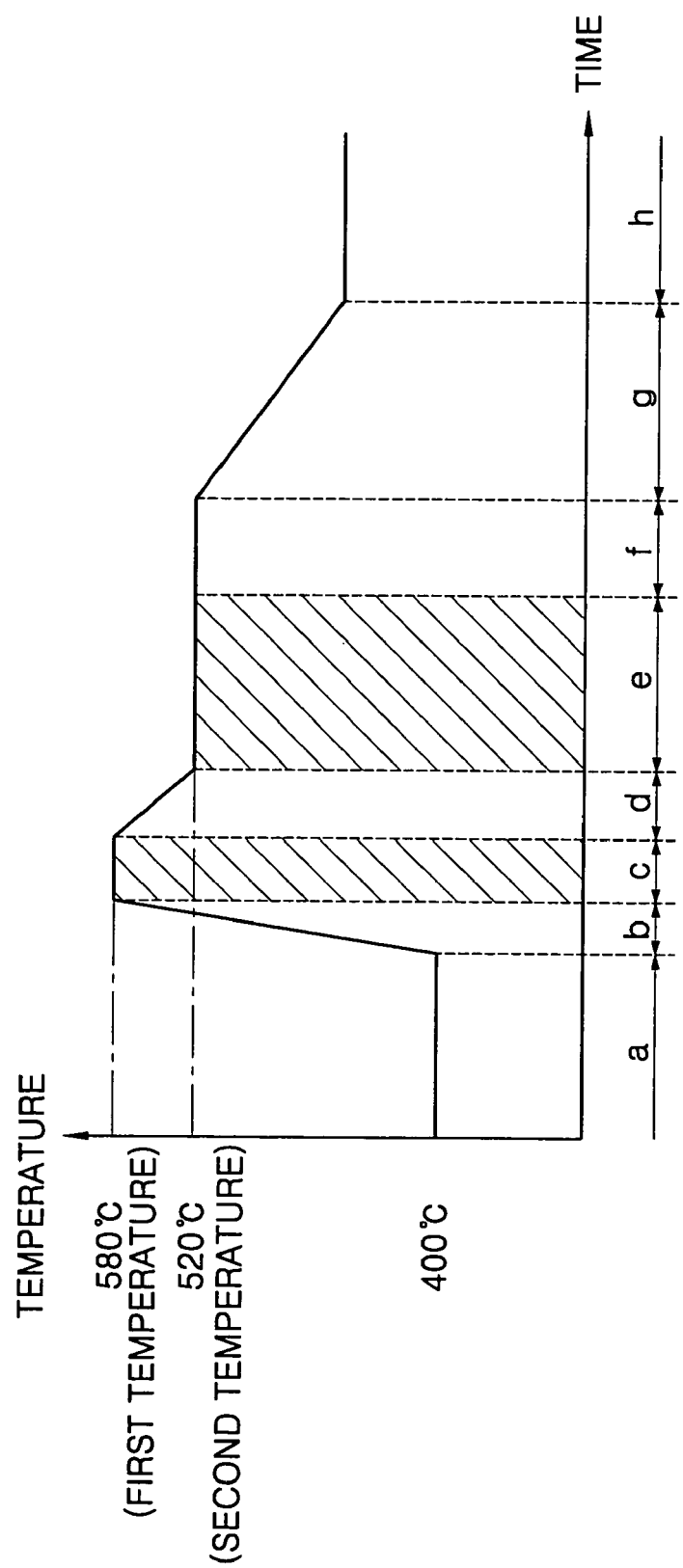
FIG. 4 shows a deposition temperature recipe of first and second floating gate layers according to an embodiment of the present invention.

FIG. 4 shows a deposition temperature recipe of the first and second floating gate layers according to an embodiment of the present invention. In FIG. 4, the vertical axis denotes temperature and the horizontal axis denotes time intervals for each step.

Referring to FIG. 3B and FIG. 4, the tunnel oxide layer 110 is formed on the semiconductor substrate 100 having the SA-STI structure and the substrate 100 is then loaded into the processing chamber of deposition equipment. In the present invention, either a batch type deposition equipment or a single type deposition equipment may be used.

Then, a pumping process is carried out to vacuumize the inside of the processing chamber while the chamber is maintained at a temperature of about 400° C. (step a).

The temperature of the processing chamber is raised to the first temperature of no less than about 530° C., preferably a high temperature of about 580° C. (step b). Next, a depositing source gas, e.g., a silane ($SiH_4$) gas of about 500 cc, and a doping gas, e.g., a phosphine ($PH_3$) gas of about 200 cc are introduced into the processing chamber, where the doped polycrystalline is deposited on the tunnel oxide layer 110 to form the first floating gate layer 112 (step c).

Continuing to refer to FIG. 3C and FIG. 4, while maintaining the vacuum state, the temperature of the processing chamber is lowered to the second temperature of no more than about 580° C., preferably a low temperature of about 520° C. (step d). Next, a depositing source gas, e.g., a silane (SiH4) gas of about 500 cc, and a second doping gas, e.g., a phosphine (PH3) gas of about 120 cc are introduced into the processing chamber, where the doped amorphous silicon is in-situ deposited on the first floating gate layer 112 to form the second floating gate layer 114 (step e).

After completing the deposition of the second floating gate layer 114, an inert purge gas including nitrogen ($N_2$) or argon (Ar) is introduced into the processing chamber to remove the remaining gas absorbed on the surface of the substrate 100 (step f). Next, the temperature of the processing chamber is lowered to a temperature of about 400° C. (step g) and the substrate 100 is then unloaded from the processing chamber (step h).

In this embodiment of the present invention, the first and second floating gate layers 112 and 114 are in-situ deposited in a single processing chamber. However, the first and second floating gate layers 112 and 114 may be in-situ deposited in separate chambers of a single piece of equipment. In other words, the first floating gate layer 112 is deposited in a first processing chamber of the deposition equipment, and then the substrate 100 on which the first floating gate layer 112 is deposited is transferred to a second processing chamber of the same deposition equipment while the vacuum state is maintained. Thereafter, the second floating gate layer 114 is deposited on the first floating gate layer 112. Here, the high vacuum is preferably maintained during the transportation of the substrate 100 from the first processing chamber to the second processing chamber.

According to another embodiment of the present invention, a substrate is loaded in a processing chamber of a deposition equipment and then, undoped polycrystalline silicon is deposited on a tunnel oxide layer formed on the substrate at a first temperature of no less than about 530° C., thereby forming a first floating gate layer. Next, the temperature of the processing chamber decreases to a second temperature of no more than about 580° C. By introducing a doping gas such as $PH_3$, doped amorphous silicon is in-situ deposited on the first floating gate layer to form a second floating gate layer.

According to still another embodiment of the present invention, after loading a substrate into a processing chamber of a deposition equipment, an undoped polycrystalline silicon is deposited on a tunnel oxide layer formed on the substrate at a first temperature of more than about 530° C., thereby forming a first floating gate layer. The temperature of the processing chamber is then lowered to a second temperature of no more than about 580° C. and undoped amorphous silicon is in-situ deposited on the first floating gate layer to form a second floating gate layer. After unloading the substrate with the second floating gate layer, a dopant such as phosphorus (P) or boron (B) is ion-implanted on the substrate to dope the first and second floating gate layers with the dopant. Then, a heat treatment is carried out at a temperature of about 300° C. or more to activate the implanted dopant.

According to the present invention described above, the first floating gate layer and the second floating gate layers are in-situ deposited in a non-volatile memory device having a SA-STI structure, thereby preventing a native oxide layer from growing on the surface of the first floating gate layer. This reduces the gate resistance and shortens the process time.

Although embodiments of the present invention have been described, it is understood that the present invention should not be limited to these embodiments. Various changes and modifications can be made by those skilled in the art without departing from the spirit and scope of the present invention as hereinafter claimed.

What is claimed is:

1. A method of manufacturing a non-volatile memory device comprising:
    forming a tunnel oxide layer on a semiconductor substrate having a self-aligned shallow trench isolation;
    depositing a first floating gate layer on the tunnel oxide layer at a first temperature of no less than about 530° C.; and
    in-situ depositing a second floating gate layer on the first floating gate layer at a second temperature of no more than about 580° C.

2. The method as claimed in claim 1, wherein the first floating gate layer comprises either doped polycrystalline silicon or undoped polycrystalline silicon.

3. The method as claimed in claim 1, wherein the second floating gate layer comprises either doped amorphous silicon or undoped amorphous silicon.

4. The method as claimed in claim 1, wherein the first temperature is in the range of approximately 530° C. to 650° C.

5. The method as claimed in claim 1, wherein the second temperature is no more than about 550° C.

6. A method of manufacturing a non-volatile memory device comprising:
    forming a tunnel oxide layer on a semiconductor substrate having a self-aligned shallow trench isolation;
    loading the substrate into a piece of deposition equipment;
    depositing a doped polycrystalline silicon on the tunnel oxide layer while introducing a first doping gas in the deposition equipment at a first temperature of more than about 530° C. to thereby form a first floating gate layer;
    in-situ depositing a doped amorphous silicon on the first floating gate layer while introducing a second doping gas in the deposition equipment at a second temperature of less than about 580° C. to thereby form a second floating gate layer; and
    unloading the substrate from the deposition equipment.

7. The method as claimed in claim 6, wherein the first and second doping gases comprise a phosphine ($PH_3$) gas.

8. The method as claimed in claim 6, wherein the first and second floating gate layers are deposited in a single processing chamber.

9. The method as claimed in claim 6, wherein the first floating gate layer is deposited in a first processing chamber of the deposition equipment and the second floating gate layer is deposited in a second processing chamber of the deposition equipment.

10. A method of manufacturing a non-volatile memory device comprising:
    forming a tunnel oxide layer on a semiconductor substrate having a self-aligned shallow trench isolation;
    loading the substrate into a piece of deposition equipment;
    depositing an undoped polycrystalline silicon on the tunnel oxide layer at a first temperature of no less than about 530° C. to thereby form a first floating gate layer;
    in-situ depositing a doped amorphous silicon on the first floating gate layer while introducing a doping gas in the deposition equipment at a second temperature of no more than about 580° C. to thereby form a second floating gate layer; and
    unloading the substrate from the deposition equipment.

11. The method as claimed in claim 10, wherein the doping gas comprises a phosphine ($PH_3$) gas.

12. The method as claimed in claim 10, wherein the first and second floating gate layers are deposited in a single processing chamber.

13. The method as claimed in claim 10, wherein the first floating gate layer is deposited in a first processing chamber of the deposition equipment and the second floating gate layer is deposited in a second processing chamber of the deposition equipment.

14. A method of manufacturing a non-volatile memory device comprising:
    forming a tunnel oxide layer on a semiconductor substrate having a self-aligned shallow trench isolation structure;
    loading the substrate into a piece of deposition equipment;
    depositing an undoped polycrystalline silicon on the tunnel oxide layer at a first temperature of no less than about 530° C. to thereby form a first floating gate layer;
    in-situ depositing an undoped amorphous silicon on the first floating gate layer at a second temperature of no more than about 580° C. to thereby form a second floating gate layer;
    unloading the substrate from the deposition equipment; and
    ion-implanting a dopant on the substrate on which the second floating gate layer is formed, to thereby dope the first and second floating gate layers with the dopant.

15. The method as claimed in claim 14, wherein the dopant comprises either phosphorus (P) or boron (B).

16. The method as claimed in claim 14, wherein the first and second floating gate layers are deposited in a single processing chamber.

17. The method as claimed in claim 14, wherein the first floating gate layer is deposited in a first processing chamber of the deposition equipment and the second floating gate layer is deposited in a second processing chamber of the deposition equipment.

18. The method as claimed in claim 14, further comprising the step of performing a heat treatment to activate the dopant, after doping the first and second floating gate layers.

19. The method as claimed in claim 18, wherein the heat treatment is carried out at a temperature of no less than about 300° C.

* * * * *